United States Patent [19]

Usui

[11] Patent Number: 5,095,225
[45] Date of Patent: Mar. 10, 1992

[54] SYNCHRONOUS RST FLIP-FLOP CIRCUITS FLOWING SMALL LEAKAGE CURRENT

[75] Inventor: Toshimasa Usui, Tokyo, Japan

[73] Assignee: NEC Corporation, Tokyo, Japan

[21] Appl. No.: 613,027

[22] Filed: Nov. 15, 1990

[30] Foreign Application Priority Data

Nov. 15, 1989 [JP] Japan .................. 1-133216[U]

[51] Int. Cl.⁵ .................. H03K 3/26; H03K 3/356
[52] U.S. Cl. .................. 307/279; 307/291; 307/451
[58] Field of Search .................. 307/279, 272.3, 291, 307/451

[56] References Cited

U.S. PATENT DOCUMENTS

| | | | |
|---|---|---|---|
| 3,895,240 | 7/1975 | Kawagoe | 307/291 X |
| 3,971,960 | 7/1976 | Means et al. | 307/279 X |
| 4,486,673 | 12/1984 | Koike | 307/279 |
| 4,678,934 | 7/1987 | Magome et al. | 307/279 |
| 4,728,823 | 3/1988 | Kinoshita | 307/451 |
| 4,806,786 | 2/1989 | Valentine | 307/279 |
| 4,837,458 | 6/1989 | Kawahata et al. | 307/279 |
| 4,939,384 | 7/1990 | Shikata et al. | 307/279 |
| 4,982,111 | 1/1991 | Nakaizumi | 307/279 |

Primary Examiner—Eugene R. Laroche
Assistant Examiner—Son Dinh
Attorney, Agent, or Firm—Sughrue, Mion, Zinn, Macpeak & Seas

[57] ABSTRACT

In a RST flip-flop circuit constructed with CMOS transistors, two transistors connected in parallel having an input signal (R,S) and a synchronizing signal (T) as the inputs are connected in series a transistor of the same conductivity type, for each of the set side and the reset side. The last mentioned transistor receives the output siganl from the opposite side, and the output signal on this side is taken out from the drain of this transistor.

4 Claims, 6 Drawing Sheets

SYNCHRONOUS RST FLIP-FLOP CIRCUITS FLOWING SMALL LEAKAGE CURRENT

BACKGROUND OF THE INVENTION

Field of the Invention

The present invention relates to synchronous reset set flip-flop circuits (referred to as RST flip-flop circuits hereinafter), and more particularly to RST flip-flop circuits composed of complementary metal oxide (CMOS) transistors.

2. Description of the Prior Art

Flip-flops perform the memory and counting operation, and are used for counters, memories, shift registers and the like. Among them, as RS flip-flop circuit is the most fundamental flip-flop circuit, and involves positive feedback closed loops with two stages of inverters. The coupling between the inverters is dc coupling for all cases, and the circuit has a feature in that it always stays at a direct-current-wise stable point for the circuit as a whole.

However, the simultaneous input of a set signal and a reset signal is inhibited because it makes the output unstable. In view of this, there was proposed an RST flip-flop circuit which validates a set signal (S) or a reset signal (R) in response to a synchronization signal (T) in order to realize a stable operation of the circuit even if a set signal and a reset signal are simultaneously input transitionally.

Now, a CMOS is composed of P-channel and N-channel MOS transistors and has been known as a circuit element effective for reducing the power consumption. It is possible to construct an RST flip-flop circuit using a CMOS.

In a conventional RST flip-flop circuit as described above, there are provided on the set side and on the reset side two stages of inverter obtained by directly coupling a first transistor and a second transistor with N-channel MOS FETs that are connected in series between an output terminal and the grounding, and a third transistor and a fourth transistor with P-channel MOS FETs that are connected in parallel between a power supply and the output terminal.

The first transistor and the third transistor of the first stage receive a set or a reset signal and the second and the fourth transistor of the first stage receive a synchronizing signal, the first transistor and the third transistor of the second stage receive the output signal of the first stage and the second transistor and the fourth transistor of the second state respectively receive the outputs of the second stage of the opposite side, that is, the output of the second stage on the reset side for the transistor on the set side and that on the set side for the transistor on the reset side. The output signal of the second stage on the set side is the output signal of the circuit as a whole, and the output signal of the second stage on the reset side is the inverted output signal of the circuit as a whole.

With the above-mentioned constitution, when the synchronizing signal goes to "1", the second transistor of the first stage is turned on and the fourth transistor is turned off. Then, the first transistor and the third transistor on the side where either of the set signal and the reset signal went to "1" are turned on and turned off, respectively. When the synchronizing signal is "0", the second transistor is turned off and the fourth transistor is turned on.

Accordingly, in either case a state cannot occur wherein the first transistor and the second transistor are turned on, and either of the third transistor or the fourth transistor is turned on, so that there should not be a current that flows from the power supply to the ground.

On the other hand, there are cases where a "1" signal is not on a sufficiently high level as a set signal or a reset signal, as, for example, in the case where a signal on the read digit line of a semiconductor memory is used. Such a situation arises when an enhancement MOS is used as a transfer gate of the memory cell. In such an example of usage, the third transistor which should be off when the input is "1" will not be turned off completely, so that a leakage current of several microamperes will flow from the power supply to the ground. As a result, the special feature of a CMOS that the standby current is substantially equal to zero cannot be exhibited.

BRIEF SUMMARY OF THE INVENTION

Object of the Invention:

It is a main object of the present invention to provide an RST flip-flop circuit in which no or small leakage current flows in it.

Summary of the Invention:

The RST flip-flop circuit in accordance with the present invention has a composite gate of identical constitution on the set side and the reset side, each gate forming a single stage inverter electrically having two inputs. Consequently, the output on the reset side gives the output for the circuit as a whole while the output on the set side gives the inverted output signal for the circuit as a whole.

Each of the constitution has three MOS transistors (a first transistor, a second transistor and a third transistor) of a first conductivity type and three MOS transistors (a fourth transistor, a fifth transistor and a sixth transistor) of a second conductivity type, with these two groups of transistors being serially connected between the power supply and the ground and their connection nodes serving as the output terminals. The first transistor and the fourth transistor receive a set signal or a reset signal, the second transistor and the fifth transistor receive a synchronizing signal and the third transistor and the sixth transistor receive the output signals of the opposite side, namely, the output signal of the reset side for the transistor on the set side and that of the set side for the transistor on the reset side.

It is preferable in the RST flip-flop circuit according to the present invention that the first conductivity type MOS transistors are of the N-channel type and the second conductivity type MOS transistors are of the P-channel type.

With such a constitution it is possible to cut down the leakage current to a substantial degree.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE INVENTION

Prior to the description of the embodiments of the present invention an explanation about the conventional RST flip-flop circuit is in order.

Figure 1:
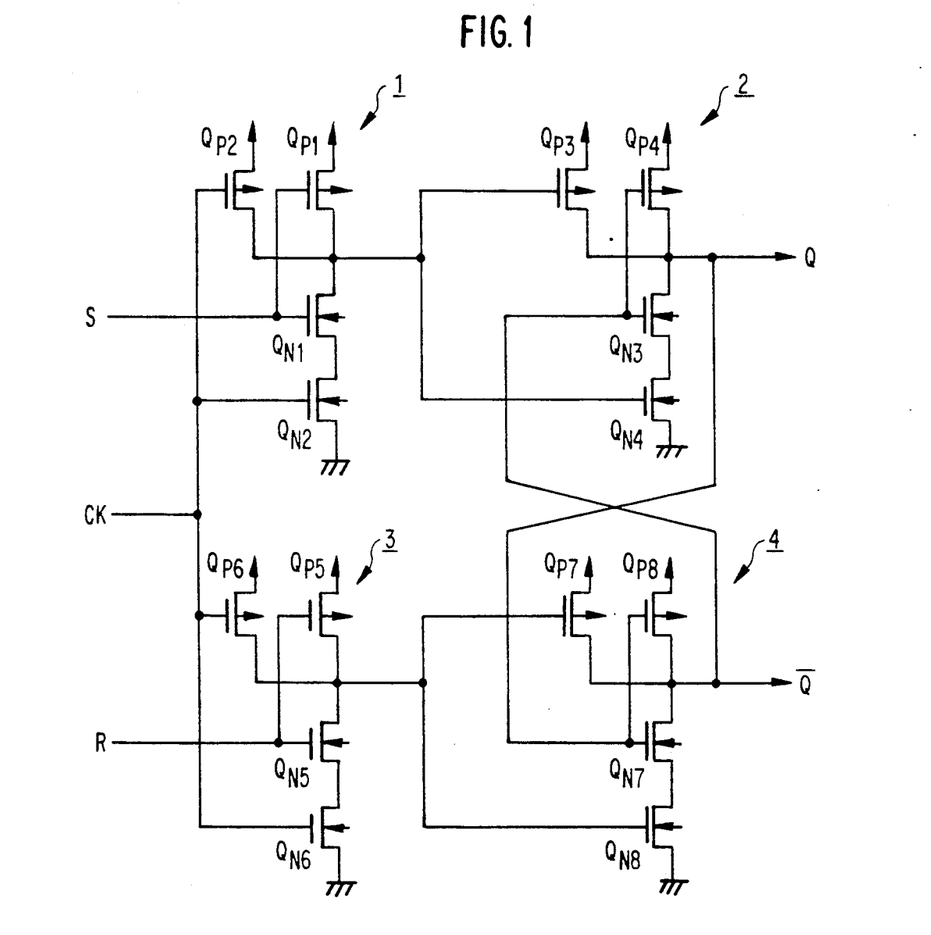
FIG. 1 is a circuit diagram on the transistor level showing an example of the conventional RST flip-flop circuit.
Figure 2:
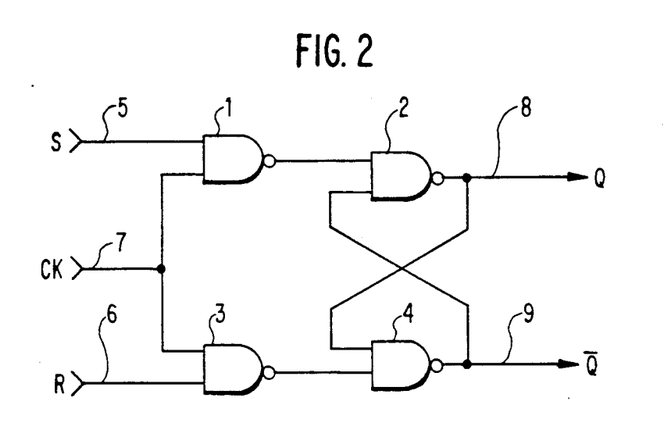
FIG. 2 is a block diagram on the gate level showing the RST flip-flop circuit in FIG. 1.

Referring to FIG. 1 and FIG. 2, the conventional RST flip-flop circuit includes four NAND gates 1, 2, 3 and 4, and each of these NAND gates is constructed by connecting in series a first transistor ($Q_{N1}$, $Q_{N3}$, $Q_{N5}$ and $Q_{N7}$) and a second transistor $Q_{N4}$, $Q_{N6}$ and $Q_{N8}$, respectively, of N-channel MOS FET between an output terminal and the ground, and connecting in parallel a third transistor ($Q_{P1}$, $Q_{P3}$, $Q_{P5}$ and $Q_{P7}$) and a fourth transistor ($Q_{P2}$, $Q_{P4}$, $Q_{P6}$ and $Q_{P8}$), respectively, of P-channel MOS FET between the power supply and the output terminal. The two-stage NAND gates 1 and 2 are directly cascaded on the set side, and similarly the two-stage NAND gates 3 and 4 are directly cascaded on the reset side.

The first transistor $Q_{N1}$ and the third transistor $Q_{P1}$, and the first transistor $P_{N5}$ and the third transistor $Q_{P5}$, of the first stages receive a set signal S and a reset signal R, respectively, the second transistors $Q_{N2}$ and $Q_{N6}$, and the fourth transistors $Q_{P2}$ and $Q_{P6}$, of the first stages receive a synchronizing signal CK, the second transistors $Q_{N4}$ and $Q_{N8}$, and the third transistors $Q_{P3}$ and $Q_{P7}$, of the second stages receive the respective outputs of the first stages, and the first transistor $Q_{N3}$ and the fourth transistor $Q_{P4}$, and the first transistor $P_{N7}$, and the fourth transistor $Q_{P8}$, receive the second stage outputs of the opposite sides, respectively, namely the output of the reset side to the transistors on the set side and the output of the set side to the transistors on the reset side. The second stage output signal Q on the set side is used as the output signal for the circuit as a whole, and the second stage output signal $\overline{Q}$ on the reset side is used as the inverted output signal for the circuit as a whole. The operation of the circuit is as described in the above.

Figure 3:
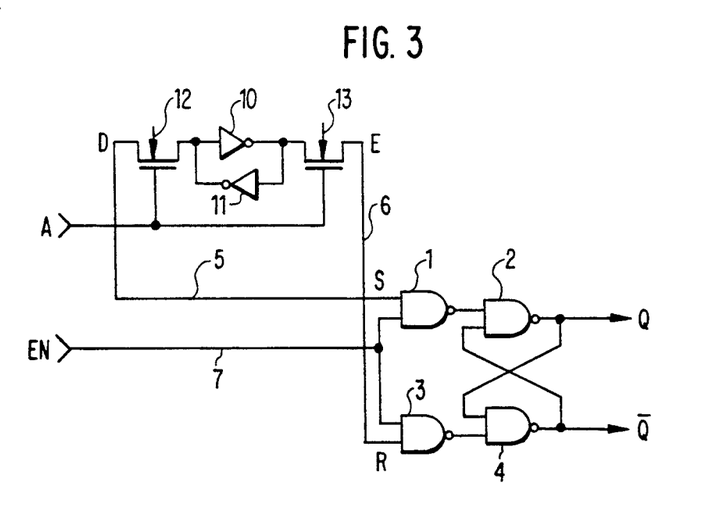
FIG. 3 is a block diagram showing an example of application of the RST flip-flop circuit shown in FIG. 1 and FIG. 2.

FIG. 3 shows an example of applying the above described RST flip-flop circuit to the data read circuit of a static random access memory (SRAM). The digit line signals D and E are used as the set signal S and the reset signal R, respectively, in FIG. 1 and FIG. 2, and an enable signal EN is used as the synchronizing signal CK. A memory cell of one bit is formed by CMOS inverter circuits 10 and 11, and N-channel MOS transistors 12 and 13.

The N-channel MOS transistors 12 and 13 work as transfer gates, and when an input signal A to the gates is "1" (high level), the data in the memory cell are output to the digit line signals D and E. On the other hand, the NAND gates 1, 2, 3 and 4 sense the signals transferred to the digit lines D and E and latch them.

Now, the transfer gates of the memory cell are constructed by N-channel MOS transistors 12 and 13 of enhancement type so that the signal level "1" of the digit line signals D and E will not be raised to the supply voltage $V_{DD}$, being lower than the supply voltage $V_{DD}$ by about the threshold $V_T$ of the transistor 12 or 13. Since the threshold $V_T$ of the N-channel MOS transistor is about 0.8 to 1.0 V and the supply voltage $V_{DD}$ is 5 V in general, the level "1" of the digit line can only be raised up to about 4 V.

In this example of application, consider the case where in the circuit in FIG. 1, a level "1" is given to the set signal S, a level "0" is given to the reset signal R and a level "1" is given to the synchronizing signal CK. In this case, the output of the NAND gate 1 goes to level "0" and the output of the NAND gate 2 goes to level "1". However, the set signal S as about 4 V even though it is said to be at level "1" so that, although the N-channel MOS transistors $Q_{N1}$ and $Q_{N2}$ are driven to a completely on state, the P-channel MOS transistor $Q_{P1}$ is not driven to a completely off state.

Because of this, a leakage current, though slight, continues to flow in the NAND gate 1 from the power supply to the ground through the transistors $Q_{P1}$, $Q_{N1}$ and $Q_{N2}$ In spite of the fact that the value of several microamperes is not so large as a leakage current that actually flows, the feature of the CMOS construction that its standby current is zero cannot be realized since the current does not become substantially zero. This leads to a drawback that the circuit is not suited for the use where a low power consumption is required.

Next, referring to FIG. 4 to FIG. 8, the embodiments of the present invention will be described.

Figure 4:
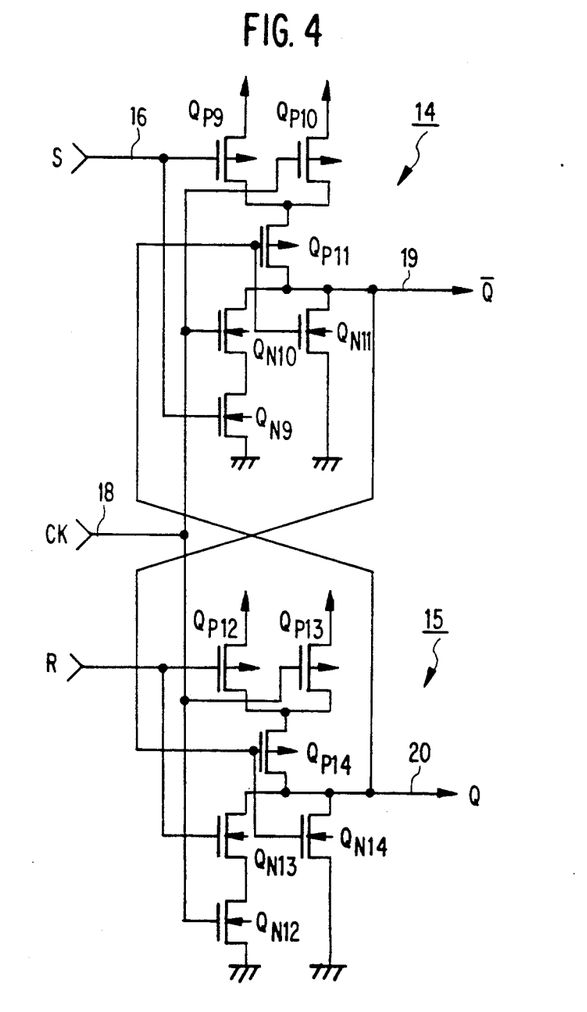
FIG. 4 is a circuit diagram on the transistor level showing a first embodiment of the RST flip-flop circuit in accordance with the present invention.
Figure 5:
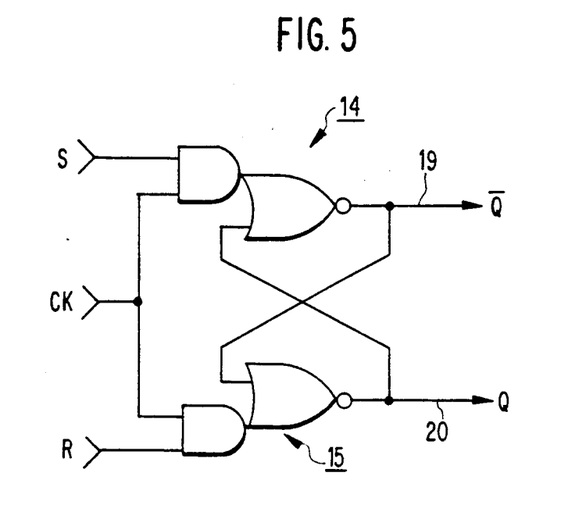
FIG. 5 is a block diagram on the gate level showing the RST flip-flop circuit in FIG. 4.

FIG. 4 is a transistor circuit diagram of the RST flip-flop in accordance with the first embodiment of the present invention, and FIG. 5 is its equivalent block diagram.

In FIG. 4 and FIG. 5, the present embodiment consists of AND-NOR composite gates 14 and 15, input terminals 16 and 17 for a set signal S and a reset signal R, an input terminal 18 for a synchronizing signal CK and output terminals 19 and 20.

The output terminal 20 outputs an output signal Q, and the output terminal 19 outputs an inverted output signal $\overline{Q}$. The inverted output signal $\overline{Q}$ has the inverted-relationship signal of the output signal Q. Referring to FIG. 4, one of the AND-NOR composite gates 14, includes three P-channel MOS transistors $Q_{P9}$ to $Q_{P11}$ and three N-channel MOS transistors $Q_{N9}$ to $Q_{N11}$, and the other composite gate 15 also includes three P-channel MOS transistors $Q_{P12}$ to $Q_{P14}$ and three N-channel MOS transistors $Q_{N12}$ to $Q_{N14}$.

The transistors $Q_{P9}$ and $Q_{P10}$ (or $Q_{P12}$ and $Q_{P13}$) are connected in parallel, with their sources connected to a power supply and their drains commonly connected and connected in series to a transistor $Q_{P11}$ (or $Q_{P14}$). The transistors $Q_{N9}$ and $Q_{N10}$ (or $Q_{N12}$ and $Q_{N13}$) are connected in series, a source of the transistor $Q_{N9}$ (or $Q_{N12}$) is connected to the ground, a drain of the transistor $Q_{N10}$ (or $Q_{N13}$) and a drain of the transistor $Q_{N11}$ (or $Q_{N14}$) are commonly connected, a source of the transistor $Q_{N11}$ (or $Q_{N14}$) is connected to the ground, and a drain of the transistor $Q_{P11}$ (or $Q_{P14}$) and the drains of the transistors $Q_{N10}$ and $Q_{N11}$ (or $Q_{N13}$ and $Q_{N14}$) are commonly connected, which is made an output terminal 19 (or 20).

As described in the above, the composite gate 14 constitutes a composite gate of a two-input AND and a NOR gates. Similarly, the composite gate 15 is also constituted of a two-input AND and a NOR gates. The output of the composite gate 14 is input to the NOR gate input terminal of the composite gate 15 (the gate input terminals of the transistors $Q_{P14}$ and $Q_{N14}$), and the output of the composite gate 15 is input to the NOR gate input terminal of the composite gate 14 (the gate input terminals of the transistors $Q_{P11}$ and $Q_{N11}$), forming an RS type latch circuit.

Accordingly, the truth table of the RS latch circuit can be represented as shown in Table 1.

TABLE 1

| CK | S | R | $Q_{n+1}$ | $P_{n+1}$ |
|---|---|---|---|---|
| 0 | — | — | $Q_n$ | $P_{n+1}$ |
| 1 | 0 | 0 | $Q_n$ | $P_{n+1}$ |
| 1 | 1 | 0 | 1 | 0 |
| 1 | 0 | 1 | 0 | 1 |

Figure 6:
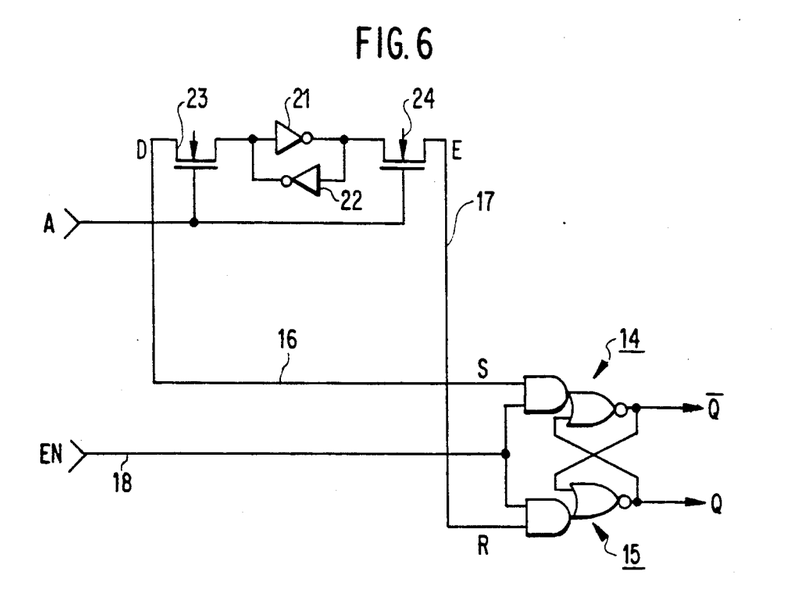
FIG. 6 is a block diagram showing an example of application of the RST flip-flop circuit shown in FIG. 4 and FIG. 5.

FIG. 6 shows an equivalent circuit for the connection between the circuit in FIG. 5 and an SRAM. In FIG. 6, there is shown a memory cell consisting of inverters 21 and 22, and transfer gates for read formed by N-channel MOS transistors 23 and 24. The true and the complementary outputs D and E are applied to the flip-flop of the present embodiment as a set signal and a reset signal S and R.

Now, if a level "1" signal is input to the set signal S, a level "0" signal is input to the reset signal R and the clock signal CK is on level "1", then the output of the composite gate 14 goes to level "0" and the output of the composite gate 15 goes to level "1". As mentioned earlier, the level "1" of the set signal S becomes lower than the supply voltage so that the transistor $Q_{P9}$ in FIG. 4 does not go to a complete off state.

However, the output Q of the composite gate 15 that is input to the gate of the transistor $Q_{P11}$ is raised completely to the supply voltage so that it is possible for the transistor $Q_{P11}$ to go to a complete off state. Accordingly, no leakage current will flow in the composite gate 14 even if the transistor $Q_{P9}$ does not go to a complete off state. Further, no leakage current flows in the composite gate 15 since the reset signal R drops completely to the ground level.

Further, when a "0" level is input to the set signal S and a "1" level is input to the reset signal R, the transistor $Q_{P12}$ does not go to a complete off-state, but the transistor $Q_{P14}$ can go to a complete off-state so that there will not flow a leakage current in it.

Figure 7:
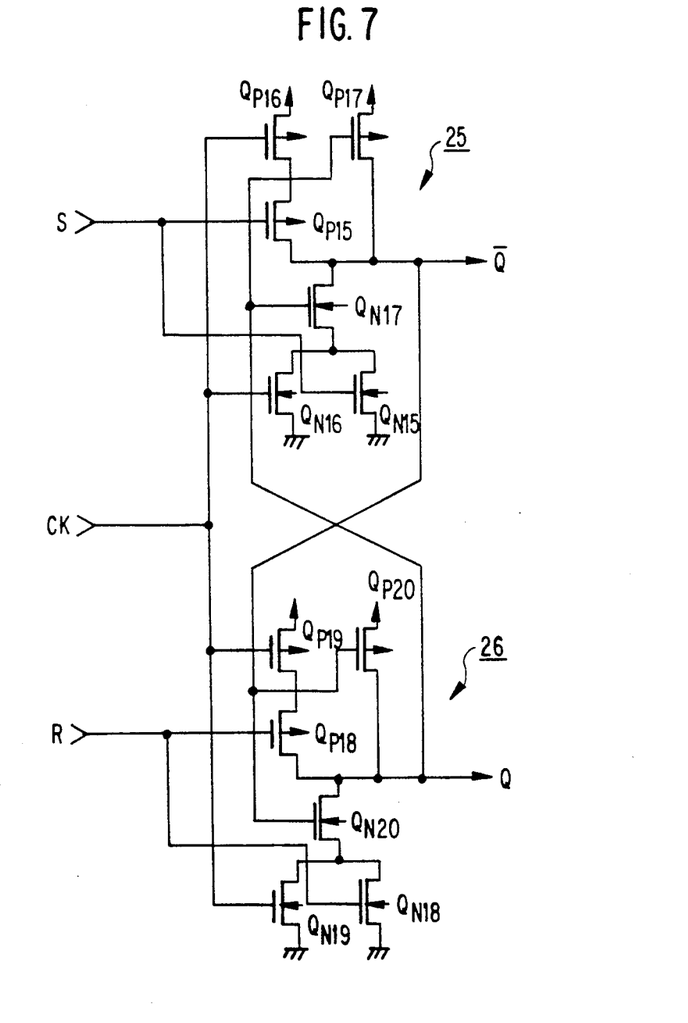
FIG. 7 is a circuit diagram on the transistor level showing a second embodiment of the RST flip-flop circuit in accordance with the present invention.
Figure 8:
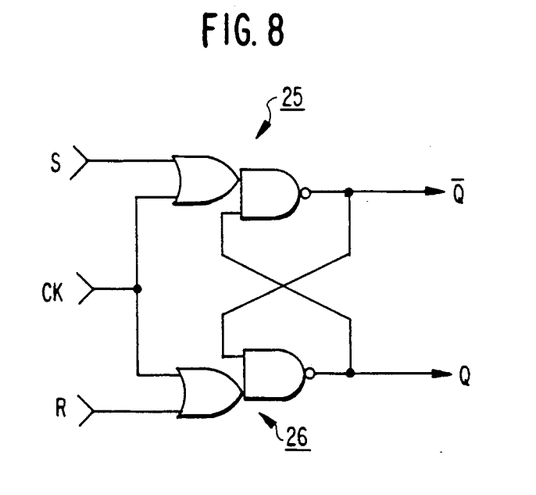
FIG. 8 is a block diagram on the gate level showing the RST flip-flop circuit in FIG. 7.

FIG. 7 and FIG. 8 show another embodiment of the present invention, wherein FIG. 7 shows it on the transistor level and FIG. 8 shows it on the gate level.

The first embodiment corresponds to an example of use of N-channel MOS transistors as the transfer gates of the SRAM cell so that use is made of composite gates in which P-channel MOS transistors $Q_{P11}$ and $Q_{P14}$ are connected in series. In contrast, the present embodiment is an example corresponding to the use of P-channel MOS transistors for the transfer gates of an SRAM cell.

As shown in FIG. 8, the present embodiment includes composite gates 25 and 26 that constitute two-input OR-NAND circuits. Each composite gate 25 (or 26) is obtained, as shown in FIG. 7, by connecting in parallel, two P-channel MOS transistors $Q_{P15}$ and $Q_{P16}$ (or $Q_{P18}$ and $Q_{P19}$) connected in series and a P-channel MOS transistor $Q_{P17}$ (or $Q_{P20}$), between a power supply and an output terminal 25 (or 26), and connecting in series, two N-channel MOS transistors $Q_{N15}$ and $Q_{N16}$ (or $Q_{N18}$ and $Q_{N19}$) connected in parallel and an N-channel MOS transistor $Q_{N17}$ (or $Q_{N20}$), between the ground and the output terminal 25 (or 26).

The set signal S (or the reset signal R) is applied to the transistors $Q_{P15}$ and $Q_{N15}$ (or $Q_{P18}$ and $Q_{N18}$), and the synchronizing signal CK is applied to the transistors $Q_{N16}$ and $Q_{P16}$ (or $Q_{N19}$ and $Q_{P19}$) The gates of the remaining transistors $Q_{P17}$ and $Q_{N17}$ (or $Q_{P20}$ and $Q_{N20}$) receive the output Q (or P) of the gate on the opposite side.

When the transfer gates of the SRAM cell are of the P-channel type, the signals output to the digit lines, namely, the set signal S and the reset signal R, on the "0" level side cannot drop completely to the ground level, so that when the N-channel MOS transistor $Q_{N17}$, and the transistors $Q_{N16}$ and $Q_{N15}$ are connected in series as in FIG. 7, the transistor $Q_{N17}$ will go to a complete off-state and no leakage current will flow, analogous to the first embodiment, even if the set signal S, that is, the input signal to the gate of the transistor $Q_{N15}$, does not drop to the ground level and the transistor $Q_{N15}$, does not go to a complete off-state since a complete ground level is input to the transistor $Q_{N17}$ from the output terminal 26. Then, it can readily be understood that the truth table shown in Table 1 is applicable as is to the RS latch circuit of the present embodiment.

As a result of the aforementioned construction of the present invention, the leakage current due to an incomplete level change of the input signal which used to be several microamperes in the conventional circuit can be made substantially equal to zero.

Moreover, as may be clear from a comparison between FIG. 4 or FIG. 7 and FIG. 1, the number of transistors can be reduced from 16 to 12.

Although the invention has been described with reference to specific embodiments, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall in the true scope of the invention.

I claim:

1. An RST flip-flop circuit including a first sub-circuit receiving a set signal and a synchronizing signal and generating an inverted output signal and a second subcircuit receiving a reset signal and said synchronizing signal and generating an output signal, said inverted output signal and said output signal are respectively applied to said second and first sub-circuit to perform a bi-stable operation, each of said first and second sub-circuits comprising:

a first transistor, a second transistor and a third transistor consisting of a first conductivity type for receiving said set signal (or said reset signal), said synchronizing signal and said output signal (or said inverted output signal), respectively; and a fourth transistor, a fifth transistor and a sixth transistor consisting of a second conductivity type for receiving said set signal (or said reset signal), said synchronizing signal and said output signal (or said inverted output signal), respectively;

said first transistor and said second transistor being connected in series between one of power supply terminals and an inverted output terminal (or an output terminal);

said third transistor being connected between said one of power supply terminals and said inverted output terminal (or said output terminal);

said fourth transistor and said fifth transistor being connected in parallel with their respective sources connected to the other of said power supply terminals; and said sixth transistor being inserted between said inverted output terminal (or said output terminal) and the drains of said fourth transistor and said fifth transistor.

2. An RST flip-flop circuit as claimed in claim 1, wherein said first to sixth transistors are MOS field effect transistors and said first conductivity type is an N-channel type, and said second conductivity type is a P-channel type.

3. An RST flip-flop circuit as claimed in claim 1, wherein said first to sixth transistors are MOS field effect transistors and said first conductivity MOS is a P-channel type, and said second conductivity type is an N-channel type.

4. An RST flip-flop circuit comprising a first and a second signal input terminals, a first and a second signal output terminals, a control signal terminal, a first and a second power supply terminals connected to one end and the other end, respectively, of the power supply and a first and a second composite gate circuits;

said first composite gate circuit including a first MOS transistor of a first conductivity type and a second MOS transistor of a second conductivity type with their gates connected commonly to said first signal input terminal, a third MOS transistor of said first conductivity type and a fourth MOS transistor of said second conductivity type with their gates connected commonly to said second signal output terminal and a fifth MOS transistor of said first conductivity type and a sixth MOS transistor of said second conductivity type with their gates connected commonly to said control signal terminal, said first MOS transistor and said fifth MOS transistor being connected in parallel and being connected in series with said third MOS transistor between said first power supply terminal and said first signal output terminal, said second MOS transistor and said sixth MOS transistor being connected in series between said first signal output terminal and said second power supply terminal and said fourth MOS transistor being connected between said first signal output terminal and said second power supply terminal; and said second composite gate circuit including a seventh MOS transistor of said first conductivity type and an eighth MOS transistor of said second conductivity type with their gates connected commonly to said second signal input terminal, a ninth MOS transistor of said first conductivity type and a tenth MOS transistor of said second conductivity type with their gates connected commonly to said first signal output terminal and an eleventh MOS transistor of said first conductivity type and a twelfth MOS transistor of said second conductivity type with their gates connected commonly to said control signal terminal, said seventh MOS transistor and said eleventh MOS transistor being connected in parallel and being connected in series to said ninth MOS transistor between said first power supply terminal and said second signal output terminal, said eighth MOS transistor and said twelfth MOS transistor being connected in series between said second signal output terminal and said second power supply terminal and said tenth MOS transistor being connected between said second signal output terminal and said second power supply terminal.

* * * * *